(12) United States Patent
Harr et al.

(10) Patent No.: US 11,587,810 B2
(45) Date of Patent: Feb. 21, 2023

(54) WAFER CUSHION

(71) Applicant: ENTEGRIS, INC., Billerica, MA (US)

(72) Inventors: Colton J. Harr, Monument, CO (US); Matthew A. Fuller, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/929,428

(22) Filed: Jul. 15, 2020

(65) Prior Publication Data

US 2021/0020482 A1 Jan. 21, 2021

Related U.S. Application Data

(60) Provisional application No. 62/876,234, filed on Jul. 19, 2019.

(51) Int. Cl.
| | |
|---|---|
| *H01L 21/673* | (2006.01) |
| *B65D 85/30* | (2006.01) |
| *B65D 81/05* | (2006.01) |
| *F16F 3/087* | (2006.01) |

(52) U.S. Cl.
CPC ...... *H01L 21/67369* (2013.01); *B65D 81/053* (2013.01); *B65D 85/30* (2013.01); *F16F 3/0876* (2013.01); *B65D 2581/051* (2013.01); *B65D 2585/30* (2013.01); *F16F 2224/02* (2013.01)

(58) Field of Classification Search
CPC . H01L 21/67369; B65D 81/053; B65D 85/20; B65D 2581/051; B65D 2581/30; F16F 3/0876; F16F 2224/02

USPC ................. 206/710, 712, 832, 711
See application file for complete search history.

(56) References Cited

U.S. PATENT DOCUMENTS

| | | | | |
|---|---|---|---|---|
| 5,207,324 A | * | 5/1993 | Kos | ............... H01L 21/67369 206/453 |
| 6,082,540 A | * | 7/2000 | Krampotich | ...... H01L 21/67369 206/445 |
| 6,951,284 B2 | * | 10/2005 | Cheesman | ........ H01L 21/67369 206/711 |
| 7,017,749 B2 | * | 3/2006 | Yajima | .............. H01L 21/67369 206/711 |
| 7,216,766 B2 | * | 5/2007 | Matsutori | ......... H01L 21/67379 206/710 |
| 7,316,315 B2 | * | 1/2008 | Matsutori | ......... H01L 21/67369 206/454 |

(Continued)

FOREIGN PATENT DOCUMENTS

| | | |
|---|---|---|
| JP | 52706682 A | 8/2011 |
| KR | 20110046035 A | 5/2011 |

*Primary Examiner* — Chun Hoi Cheung

(57) ABSTRACT

Wafer cushions for use in wafer carriers include spring beams that include a first arm extending from the frame of the wafer cushion in a first direction and a second arm extending from the first arm in a second direction, and a wafer contact at the end of the second arm opposite where the second arm is joined to the first arm. The wafer cushion may contact a substrate within the wafer carrier only at the wafer contacts during normal conditions. The substrate may also contact secondary contact points on the second arm when a shock event occurs. The wafer contact can be v-groove style wafer contact. The wafer contact may include a contact surface having a convex surface where it is configured to contact the wafer.

12 Claims, 4 Drawing Sheets

(56) References Cited

U.S. PATENT DOCUMENTS

| | | | |
|---|---|---|---|
| 7,523,830 B2* | 4/2009 | Burns | H01L 21/67369 206/711 |
| 7,909,166 B2* | 3/2011 | Lin | H01L 21/67373 206/710 |
| 7,909,167 B2* | 3/2011 | Chiu | H01L 21/67369 206/710 |
| 8,118,169 B2* | 2/2012 | Hosoi | H01L 21/67369 206/711 |
| 8,453,842 B2* | 6/2013 | Inoue | H01L 21/67366 206/711 |
| 8,464,872 B2* | 6/2013 | Inoue | H01L 21/67383 206/711 |
| 8,528,738 B2* | 9/2013 | Wiseman | H01L 21/67369 206/711 |
| 8,910,792 B2* | 12/2014 | Nagashima | H01L 21/67383 206/711 |
| 9,633,877 B2* | 4/2017 | Gregerson | H01L 21/67369 |
| 9,698,033 B2* | 7/2017 | Matsutori | H01L 21/67369 |
| 2003/0132133 A1 | 7/2003 | Cheesman | |
| 2005/0115865 A1* | 6/2005 | Matsutori | H01L 21/67383 206/710 |
| 2006/0042998 A1* | 3/2006 | Haggard | H01L 21/67369 206/711 |
| 2007/0295638 A1* | 12/2007 | Nakatogawa | H01L 21/67383 206/711 |
| 2010/0025288 A1* | 2/2010 | Lin | H01L 21/67369 206/711 |
| 2010/0072107 A1* | 3/2010 | Mimura | H01L 21/67369 206/711 |
| 2010/0108565 A1* | 5/2010 | Lu | H01L 21/67369 206/711 |
| 2013/0056389 A1* | 3/2013 | Gregerson | H01L 21/67386 206/711 |
| 2013/0146503 A1 | 6/2013 | Wang | |
| 2015/0068949 A1* | 3/2015 | Raschke | H01L 21/67383 206/711 |
| 2017/0365496 A1 | 12/2017 | Mushel | |

\* cited by examiner

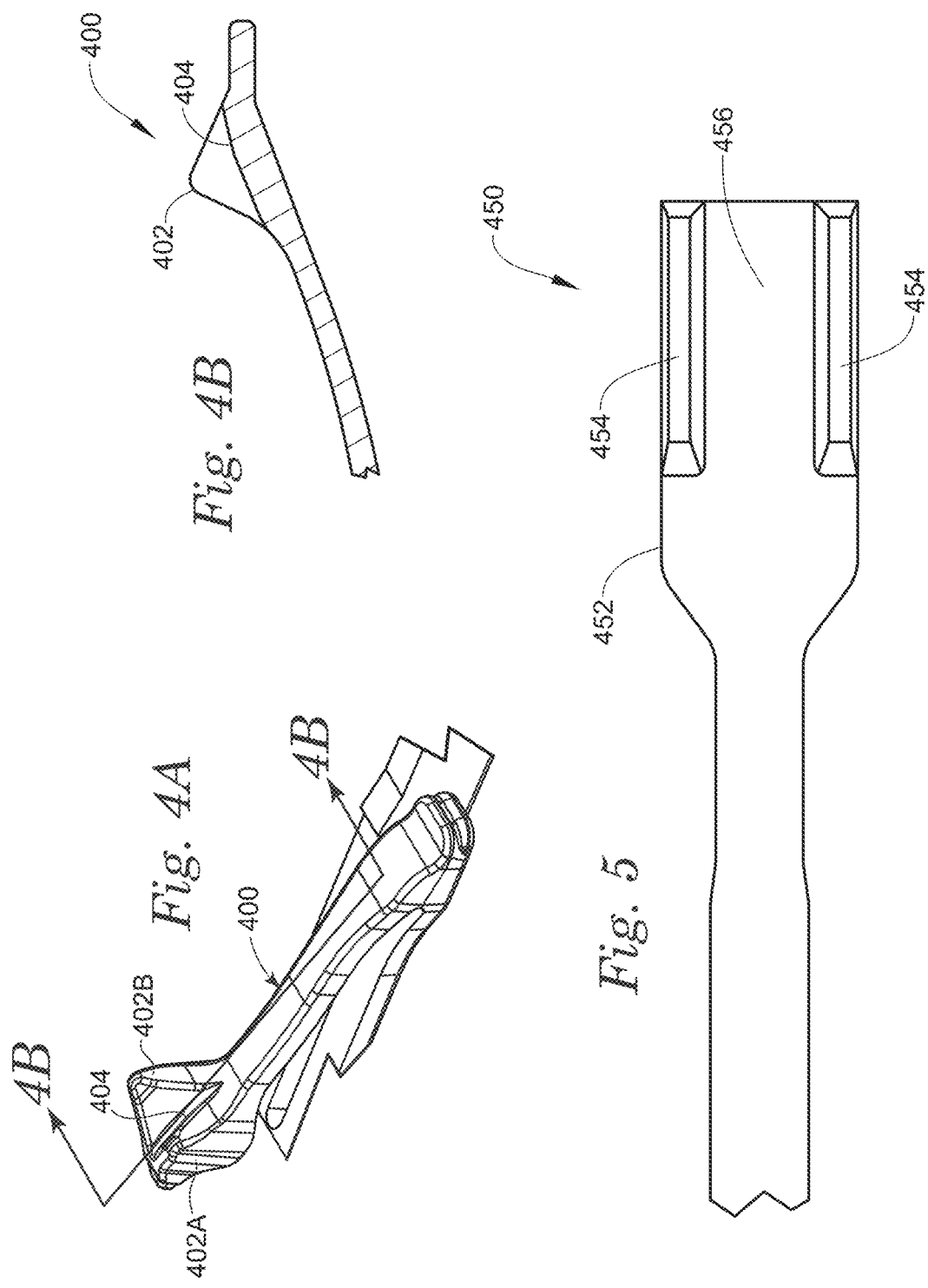

WAFER CUSHION

CROSS REFERENCE TO RELATED APPLICATION

This application claims priority to and the benefit of U.S. Provisional Application No. 62/876,234 filed, Jul. 19, 2019, the entirety of which is incorporated herein by reference for all purposes.

TECHNICAL FIELD

This disclosure is directed to wafer cushions for use in wafer carriers, for example in wafer carriers used for semiconductor processing such as front opening unified pods ("FOUPs").

BACKGROUND

Wafer carriers can be manually or automatically handled or transported. Such transport and handling may result in physical shocks to the carrier. Such shock events include, for example, sudden acceleration or deceleration of the carrier, for example due to dropping, mishandling, braking of a transport vehicle, and other such movement of the wafer carrier or another acceleration or deceleration of greater than approximately 2 m/s$^2$. Wafer cushions are used in wafer carriers to restrict movement of wafers such as semiconductor substrates within the carrier, for example to prevent wafers from impacting a side of the carrier when a physical shock occurs.

Wafer cushions typically include arms that extend from the frame to the centerline of the door and ending at a contact point where the wafer contacts the wafer cushion. Contact at these contact points prevents the wafer from hitting other wafers or parts of the inside of the wafer carrier, reducing the chance of damage when the wafer carrier experiences a shock event.

The wafer cushions must provide consistent force to the wafers contained within the wafer carrier to provide retention and maintain retention forces within predetermined ranges to prevent damage to the wafer or generation of particles which can adversely impact semiconductor processing and manufacture.

SUMMARY

This disclosure is directed to wafer cushions for use in wafer carriers, for example in wafer carriers used for semiconductor processing such as FOUPs.

By using v-springs, the moment arm between contact with the wafer and the frame of the wafer cushion is reduced. Shortening this moment arm may reduce twisting forces on the wafer cushion, reduce unevenness in deflection and reduce imbalances in retention force of the wafer cushion.

In an embodiment, a wafer cushion includes a frame and a plurality of spring beams. Each of the plurality of spring beams includes a first arm, joined to the frame and extending in a first direction to a first arm end, a second arm joined to the first arm at the first arm end and extending in a second direction, different from the first direction, to a second arm end, and a wafer contact joined to the second arm at the second arm end.

In an embodiment, the plurality of spring beams is configured such that when a wafer is supported by two of the plurality of spring beams, the wafer only contacts the wafer contacts at the ends of the second arms of the two of the plurality of spring beams.

In an embodiment, the wafer contact is a V-groove wafer contact. In an embodiment, the wafer contact is a paddle wafer contact.

In an embodiment, the surface of the wafer contact configured to contact a wafer has a convex surface.

In an embodiment, the first arm is joined to the frame at a perimeter of the frame, and the first direction is towards a center line of the frame.

In an embodiment, each of the spring beams includes a secondary contact point on the second arm, located where the second arm is joined to the first arm, and wherein the secondary wafer contact is configured to contact a wafer only when a shock event occurs.

In an embodiment, a wafer carrier includes a wafer cushion, and the wafer cushion includes a frame and a plurality of spring beams. Each of the plurality of spring beams includes a first arm, joined to the frame and extending in a first direction to a first arm end, a second arm joined to the first arm at the first arm end and extending in a second direction, different from the first direction, to a second arm end, and a wafer contact joined to the second arm at the second arm end.

In an embodiment, the wafer cushion is mounted on a door of the wafer carrier.

In an embodiment, the wafer carrier is a front opening unified pod.

In an embodiment, a method of supporting a substrate includes contacting the substrate at two wafer contacts, wherein each of the two wafer contacts joined to a separate spring beams, the spring beams each including a first arm extending in a first direction and a second arm, joined to the first and extending in a second direction, different from the first direction, and the wafer contacts are at ends of the second arms opposite where the second arms are joined to the first arms.

In an embodiment, the method further includes contacting the substrate at two secondary contact points on the second arms of the v-springs on which the wafer contacts are located when a shock event occurs.

In an embodiment, the substrate is in contact with the spring beams only at the two wafer contacts.

In an embodiment, the wafer contacts have a convex surface where they are configured to contact the substrate.

DRAWINGS

The disclosure may be more completely understood in consideration of the following description of various illustrative embodiments in connection with the accompanying drawings.

FIG. 4A shows a perspective view of a wafer contact according to an embodiment.

FIG. 4B shows a sectional view of the wafer contact of FIG. 4A taken along line 4A-4A.

FIG. 5 shows a plan view of a wafer contact according to an embodiment.

Figure 1:
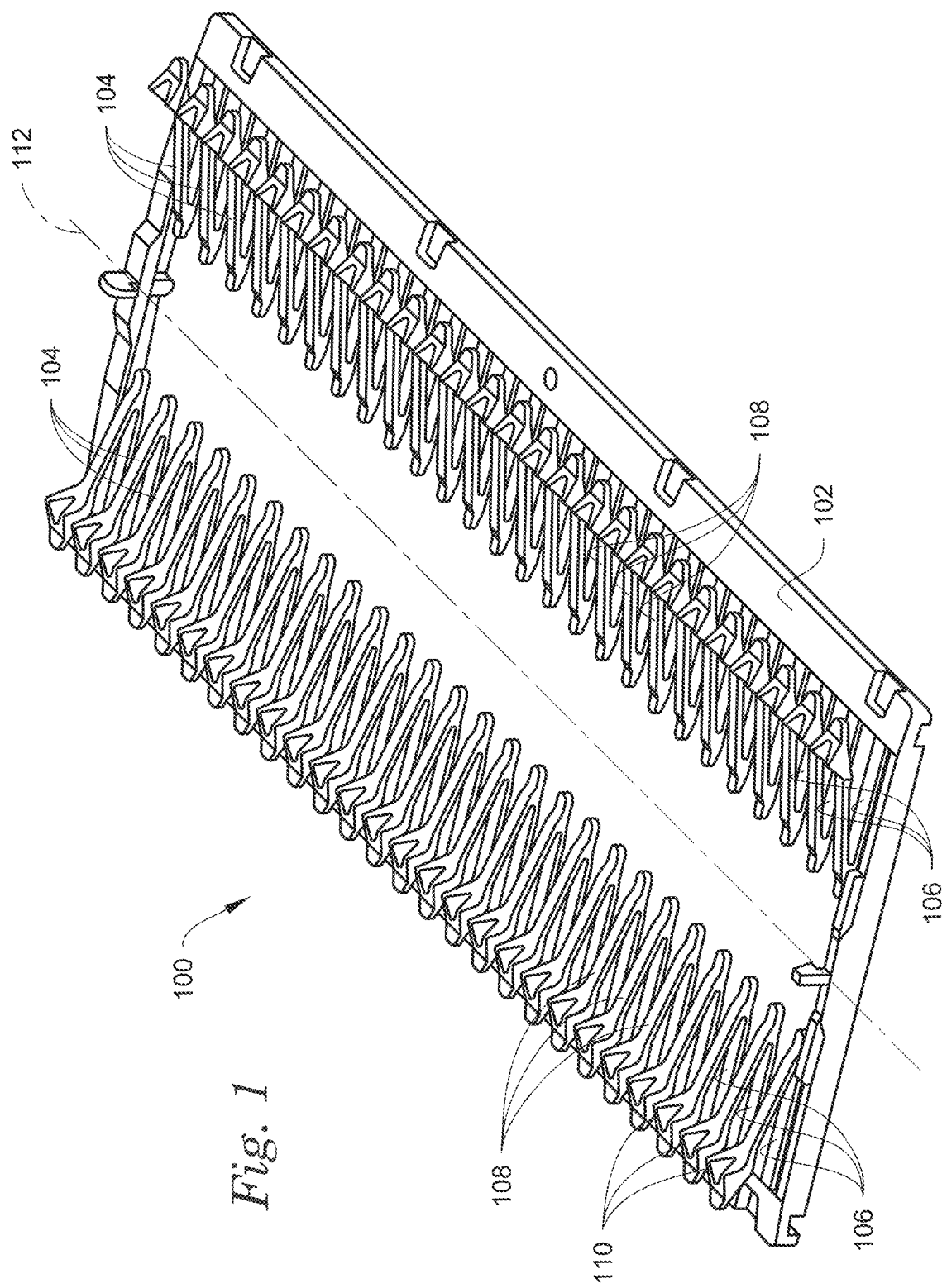
FIG. 1 shows a perspective view of a wafer cushion according to an embodiment.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1.5, 2, 2.75, 3, 3.80, 4 and 5).

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

FIG. 1 shows a perspective view of a wafer cushion 100 according to an embodiment. Wafer cushion 100 is a component that can be incorporated into a wafer carrier (not shown), for example joined to a part of the wafer carrier facing an internal space of the wafer carrier, such as, for example, the inside of a door of the wafer carrier. Wafer cushion 100 may include features (not shown) allowing joining to the wafer carrier such as, for non-limiting examples, one or more mechanical engagement features such as a snap, flange, tab, or slot, an adhesive joint, or other such feature to join the wafer cushion 100 to a wafer carrier or a portion of a wafer carrier such as a door of the wafer carrier. Wafer cushion 100 may mechanically retain substrates within the wafer carrier by contacting the substrates, for example at wafer contacts 110. Wafer cushion 100 may use spring force to restrict the movement of substrates, such that significant displacement of the substrates or contact of the substrates with walls of internal spaces of the wafer carrier are prevented.

Wafer cushion 100 includes frame 102. A number of spring beams 104 are joined to the frame 102. Each of spring beams 104 includes a first arm 106, joined to frame 102 and extending in a first direction, and a second arm 108, joined to the first arm 106 at an end of first arm 106 opposite where first arm 106 is joined to frame 102. Second arm 108 extends in a second direction from where it is joined to first arm 106, different from the first direction in which first arm 106 extends from frame 102. Each of spring beams 104 includes a wafer contact 110 at an end of the second arm 108 opposite where second arm 108 is joined to first arm 106.

Frame 102 provides support and positioning for spring beams 104, which include wafer contact points 110. In an embodiment, frame 102 is rectangular in shape, with a center line 112 extending along the major direction of the frame 102. In an embodiment, frame 102 includes an outer portion forming the perimeter of the rectangle and a rib extending along the center line 112 from one end of frame 102 to the other. In an embodiment, frame 102 is configured to fit within a recess on a door of a wafer carrier (not shown). In an embodiment, the features of the wafer cushion 100 configured to join the wafer cushion 100 to a wafer carrier or portion thereof can be located on frame 102. Frame 102 may have other shapes, such that wafer carrier 100 can be accommodated within an internal space of a wafer carrier and such that spring beams 104 can be joined to it such that the spring beams 104 provide wafer contacts 110 such that the wafer contacts 110 may engage substrates within the wafer carrier.

Each of spring beams 104 is joined to frame 102. Each of spring beams 104 includes a wafer contact 110. Spring beams 104 may be, as non-limiting examples, spring boards, cantilever type linear flex springs, or v-springs. Spring beams 104 can be arranged into pairs, with each pair configured to contact one substrate via the wafer contacts 110 of the spring beams 104 in the pair, when the substrate is placed within the wafer carrier. Spring beams 104 may all be arranged such that the spring beams 104 present the wafer contacts 110 on the same side of frame 102 with respect to an internal space of a wafer carrier, for example extending into the external space of a wafer carrier when the wafer cushion 100 is installed into the wafer carrier. Spring beams 104 can be aligned with one another opposite the center line 112 of frame 102 with respect to the frame 102 such that the spring beams 104 together provide two wafer contacts 110 positioned to contact one substrate when the substrate is placed within a wafer carrier into which wafer cushion 100 is installed.

First arm 106 is joined to frame 102 at a first end and joined to second arm 108 at a second end, opposite the first end. In an embodiment, first arm 106 extends inwardly relative to the frame 102, from a perimeter of the frame 102 towards a center line 112 of the frame 102. In an embodiment, first arm 106 tapers as it extends from frame 102 to center line 112 of frame 102.

Second arm 108 is joined to first arm 106. Second arm 108 can be joined to first arm 106 at an end of the first arm 106 opposite where first arm 106 is joined to frame 102. Second arm 108 may extend in a second direction different from the first direction in which first arm 106 extends. Second arm 108 may extend in a direction opposite to that which first arm 106 extends with respect to the perimeter of frame 102 and center line 112 of frame 102. For example, in an embodiment where first arm 106 extends inwardly from the perimeter of frame 102 towards center line 112, the second arm 108 may extend in the opposite direction away from center line 112.

Second arm 108 can be joined to first arm 106 such that an angle is formed between first arm 106 and second arm 108. In an embodiment, the angle between the first arm 106 and the frame 102 is within a range from 0° to 40°. In an embodiment, the angle between the first arm 106 and the second arm 108 is within a range from 5° to 40°. In an embodiment, the ratio of the length of second arm 108 to the length of first arm 106 can be within a range from 2:1 to 1:3. In an embodiment, second arm 108 may have a length that is at least half the length of first arm 106. In an embodiment where the wafer cushion 100 is configured for use in a 300 mm FOUP, the first arm 106 may have a length in the range from 15 mm to 45 mm. In an embodiment where wafer cushion 100 is positioned in a recess within a wafer carrier, the lengths and angles of the first arm 106 and second arm 108 may be such that the wafer contacts 110 are located within the recess in the wafer carrier.

Wafer contact 110 is located at the end of second arm 108, opposite where second arm 108 is joined to first arm 106. Wafer contact 110 is a feature configured to engage a substrate when the substrate is within the wafer container. Wafer contact 110 may include a surface configured to contact an edge of the substrate. In an embodiment, the surface configured to contact the edge of the substrate can be curved, with a convex shape. The convex shape may provide a rolling interface between wafer contact 110 and the substrate, and may limit the generation of particles by contact between the substrate and an edge or point along the surface. In an embodiment, wafer contact 110 is a v-groove wafer contact including ears extending away from one another, with the surface configured to contact the edge of the substrate at or near the vertex of a V-shape formed by the ears as the extend away from one another. Such a wafer contact is shown in FIG. 4A and described below. In an embodiment, wafer contact 110 is a paddle-style wafer contact, with a widened portion and two ears extending from the widened portion, parallel to one another. When the wafer contact 110 is a paddle-style wafer contact, the surface configured to contact the substrate located between the ears. Such a wafer contact is shown in FIG. 5 and described below. In an embodiment, wafer contacts 110 are the only feature configured to contact the substrate included in wafer cushion 100. In an embodiment, no other wafer contacts are provided aside from wafer contacts 110 located at an end of the second arms 108 opposite where the second arms 108 are joined to first arms 106.

In an embodiment, each of frame 102, spring beams 104, and wafer contact 110 can be each made of one or more polymers, such as injection moldable polymers. In an embodiment, the one or more polymers include one or more polyolefins. In an embodiment, the one or more polymers include polycarbonate. In an embodiment, a carbon fill is included in the one or more polymers. In an embodiment, the one or more polymers are thermoplastic polymers. In an embodiment, the one or more polymers are selected based on material shedding at one or more of interfaces between the wafer cushion 100 and the wafer carrier, or interfaces between the wafer cushion 100 and the substrate. In an embodiment, wafer cushion 100 is formed as a single piece, for example by a method such as, as a non-limiting example, injection molding. In an embodiment, the entire wafer cushion 100 is formed of the same material or combination of materials.

Figure 2:
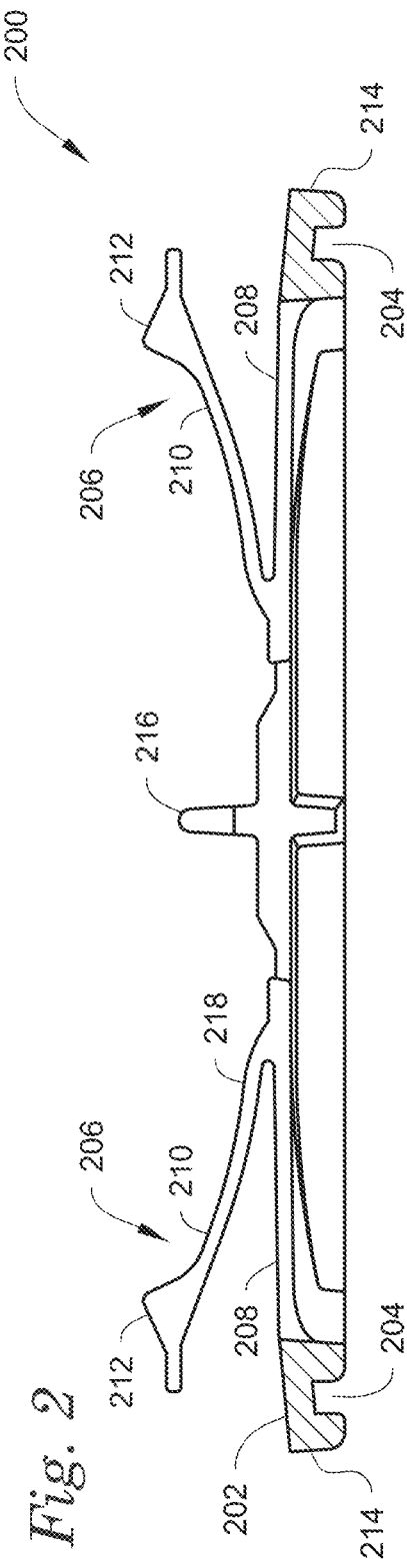
FIG. 2 shows a sectional view of a wafer cushion according to an embodiment.

FIG. 2 shows a sectional view of a wafer cushion 200 according to an embodiment. Frame 202 includes grooves 204 to receive projections from a wafer carrier. Spring beam 206 includes first arm 208 extending in a first direction from frame 202 to an end, where first arm 208 is joined to second arm 210. Second arm 210 extends in a second direction from where it is joined to wafer contact 212.

Frame 202 includes outer portions 214 defining the perimeter of frame 202. Vertical projections 216 can be included in frame 202, for example to add rigidity to the frame 202, assist with alignment of the frame 202 within the wafer carrier, interface with features of the wafer carrier, or perform other functions within the wafer carrier.

Grooves 204 can receive one or more retaining features of a wafer carrier (not shown) into which wafer cushion 200 is installed, to align the frame within the wafer carrier. The retaining features of the wafer carrier can, in a non-limiting embodiment, include a flange (not shown) which may snap into an opening (not shown) through frame 202 along groove 204, to provide a snap fit between the frame 202 and the wafer carrier.

In the embodiment shown in FIG. 2, spring beams 206 are located on each side of frame 202, joined to outer portions 214. First arms 208 extend inwards from the outer portions 214 of frame 202, towards a center line of frame 202.

Second arms 210 are joined to first arms 208 at the end of first arms 208 opposite where they are joined to the frame 202. Second arms 210 extend from where they are joined to first arms 208 in a second direction, different from the direction in which first arms 208 extend. The second direction can be opposite the first direction with respect to the perimeter and center line of frame 202. In an embodiment, second arm 210 can be joined to first arm 208 such that an angle is formed between first arm 208 and second arm 210. Second arm 210 can be joined to first arm 208 such that an angle is formed between first arm 208 and second arm 210. In an embodiment, the angle between the first arm 208 and the frame 202 is within a range from 0° to 40°. In an embodiment, the angle between the first arm 208 and the second arm 210 is within a range from 5° to 40°. In an embodiment, the ratio of the length of second arm 210 to the length of first arm 208 can be within a range from 2:1 to 1:3. In an embodiment, second arm 210 may have a length that is at least half the length of first arm 208. In an embodiment where the wafer cushion 200 is configured for use in a 300 mm FOUP, the first arm 208 may have a length in the range from 25 mm to 45 mm. In an embodiment where wafer cushion 200 is positioned in a recess within a wafer carrier, the lengths and angles of the first arm 208 and second arm 210 can be such that the wafer contacts 220 are located within the recess in the wafer carrier.

As shown in FIG. 2, second arms 210 can be curved as they extend from first arm 208 to wafer contact 212. Second arms 210 are curved in an upward direction away from first arm 208 to wafer contact 212. The curve of the second arms 210 can be such that when a substrate is in contact with wafer contacts 212, the closest portion to the substrate outside the wafer contact 212 is secondary contact points 218, located at or near where second arms 210 are joined to first arms 208. Secondary contact points 218 may contact the wafer under certain conditions, such as a shock event. Such shock events may include, as non-limiting examples, sudden acceleration or deceleration of the carrier, for example due to dropping, mishandling, braking of a transport vehicle, and other such movement of the wafer carrier, to supplement the retention force. In an embodiment, the secondary contact points 218 may also contact the wafer when the wafer is oversized for the wafer carrier, for example when a 301 mm or larger wafer is placed into a 300 mm FOUP.

Wafer contact 212 is joined to second arm 210 at an end of second arm 210 opposite where second arm 210 is joined to first arm 208. Wafer contact 212 is a feature configured to engage a substrate when the substrate is within the wafer container. Wafer contact 212 may include a surface configured to contact an edge of the substrate. In an embodiment, the surface configured to contact the edge of the substrate can be curved, with a convex shape. The convex shape may provide a rolling interface between wafer contact 212 and the substrate. The rolling interface may reduce the generation of particles by contact between the substrate and an edge or point along the surface. In an embodiment, wafer contact 212 is a v-groove wafer contact including ears extending away from one another, with the surface configured to contact the edge of the substrate at or near the vertex of a V-shape formed by the ears as the extend away from one another. Such a wafer contact is shown in FIG. 4A and described below. In an embodiment, wafer contact 212 is a paddle-style wafer contact, with a widened portion and two ears extending from the widened portion, parallel to one another. When the wafer contact 212 is a paddle-style wafer contact, the surface configured to contact the substrate located between the ears. Such a wafer contact is shown in FIG. 5 and described below.

Figure 3:
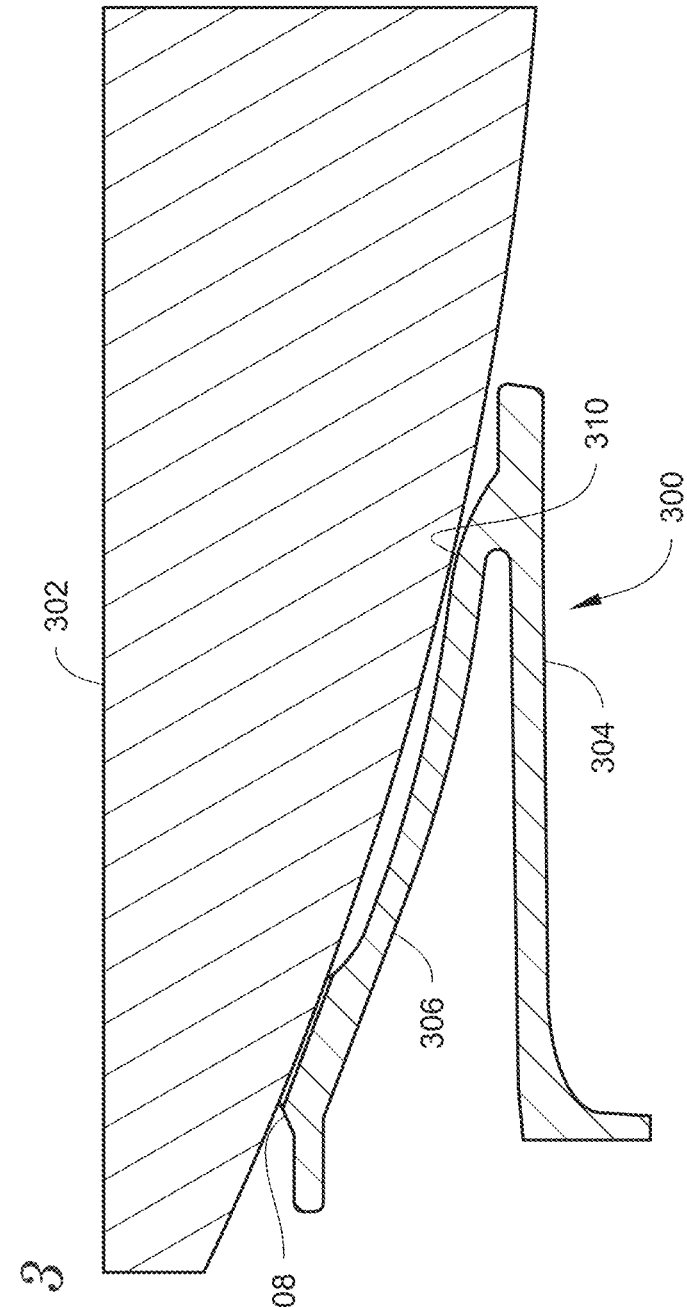
FIG. 3 shows a sectional view of a portion of a wafer cushion according to an embodiment when a substrate is in contact with the wafer cushion.

FIG. 3 shows a sectional view of a spring beam 300 according to an embodiment when a substrate 302 is in contact with the wafer cushion including the spring beam 300. Spring beam 300 includes a first arm 304, a second arm 306, and a wafer contact 308.

Substrate 302 is, as a non-limiting example, a substrate used in semiconductor manufacture. Substrate 302 can be placed in a wafer carrier including wafer cushion for transport or processing, such as during manufacture of a semiconductor using the substrate.

First arm 304 is joined to a frame such as frame 102 or frame 202, or formed integrally or joined directly to a portion of a wafer carrier, such as a FOUP. First arm 304 extends in a first direction from where it is joined to the frame or surface of the wafer carrier to a first arm end 304 where it is joined to second arm 306.

Second arm 306 extends from first arm 304 to wafer contact 308. As can be seen in FIG. 3, second arm 306 bends as it extends from the end where it is joined to first arm 304 to the end including wafer contact 308. This bend may result in a secondary contact point 310 being located at or near where the second arm 306 is joined to the first arm 304, that is the point on second arm 306 closest to the substrate 302. Secondary contact point 310 may contact the wafer under certain conditions, such as shock events. Such shock events may include, as non-limiting examples, sudden acceleration or deceleration of the carrier, for example due to dropping, mishandling, braking of a transport vehicle, and other such movement of the wafer carrier. When secondary contact point 310 as well as wafer contact 308 contact substrate 302, spring beam 300 provides additional retention force to the substrate 302.

Wafer contact 308 is where spring beam 300 contacts the substrate 302. Wafer contact 308 may include, for example as shown in FIG. 3, a v-groove wafer contact, where the substrate 302 is held between two ears that form a V-shape. In the section view of FIG. 3, one of the ears, ear 312, is visible, partially obscured by substrate 302 that is in contact with ear 312. Surfaces of the wafer contact 308 contacting substrate 302 may have a convex surface, curved and bowing outwards towards substrate 302. The convex surface may allow contact with the substrate 302 to be a rolling type contact, and reduce points of increases stress or particle generation by the contact between substrate 302 and wafer contact 308.

As shown in FIG. 3, the substrate 302 contacts only the wafer contact 308 of the spring beam in normal conditions. Displacement of the substrate 302 and deflection of the second arm of the spring beam during a shock event may allow the substrate 302 to contact secondary contact point 310 of spring beam 300 when acceleration of the substrate with respect to the wafer carrier exceeds a threshold, for example during a shock event. Shock events can be defined according to the particular application and the handling procedures for the wafer carrier. In a non-limiting embodiment, a shock event can be defined by acceleration or deceleration of the wafer carrier that is greater than approximately 2 m/s$^2$. In some embodiments, spring beam 300 can be configured so that only wafer contacts 308 are in contact with substrate 302 under all conditions, including shock events as well as normal handling of a wafer carrier. In an embodiment, secondary contact point 310 may also be contacted, for example, when the substrate 302 is oversized with respect to the wafer carrier, for example when substrate 302 is a 301 mm or larger wafer and the wafer carrier including spring beam 300 is a 300 mm FOUP.

FIG. 4A is a perspective view of a wafer contact 400 according to an embodiment. FIG. 4B is a cross sectional view of the wafer contact 400 shown in FIG. 4A. In the embodiment shown in FIGS. 4A and 4B, the wafer contact 400 is a V-groove wafer contact. Wafer contact 400 can be located at an end of an arm of a spring beam, such as second arm 108 of spring beam 104 described above and shown in FIG. 1 or second arm 210 spring beam 206 described above and shown in FIG. 2. The wafer contact 400 is a V-groove wafer contact including a first ear 402A, and a second ear 402B. Contact surface 404 is located where the first ear 402A is joined to the second ear 402B. As can be seen in FIG. 4A, the contact surface 404 may have a convex shape. The second ear can be a mirror image of first ear 402. The first ear 402A and the second ear 402B diverge as they extend away from the contact surface 404, forming a V-shape with contact surface 404 as the vertex. When the wafer contact is contacting a substrate, the substrate may contact the contact surface and portions of the first ear 402A and the second ear 402B. The particular points of contact may vary with the particular geometry of the wafer contacted by wafer contact 400.

FIG. 5 shows a plan view of a wafer contact 450 according to an embodiment. In the embodiment shown in FIG. 5, the wafer contact 450 is a paddle wafer contact. Wafer contact 450 can be located at an end of an arm of a spring beam, such as second arm 108 of spring beam 104 described above and shown in FIG. 1 or second arm 210 spring beam 206 described above and shown in FIG. 2. Wafer contact 450 may include a broadened portion 452 having a width greater than the width of the arm of the spring beam to which wafer contact 450 is attached. Two ears 454 may extend from the broadened portion 452. In an embodiment, the two ears 454 extend parallel to one another and perpendicular to the contact surface 456. The contact surface 456 can be between the ears 454 on the broadened portion 452 of wafer contact 450. The contact surface 456 can be convex, and include a curve bulging outward in the direction the ears 454 extend. The particular points of contact may vary with the particular geometry of the wafer contacted by wafer contact 400.

Figure 6:
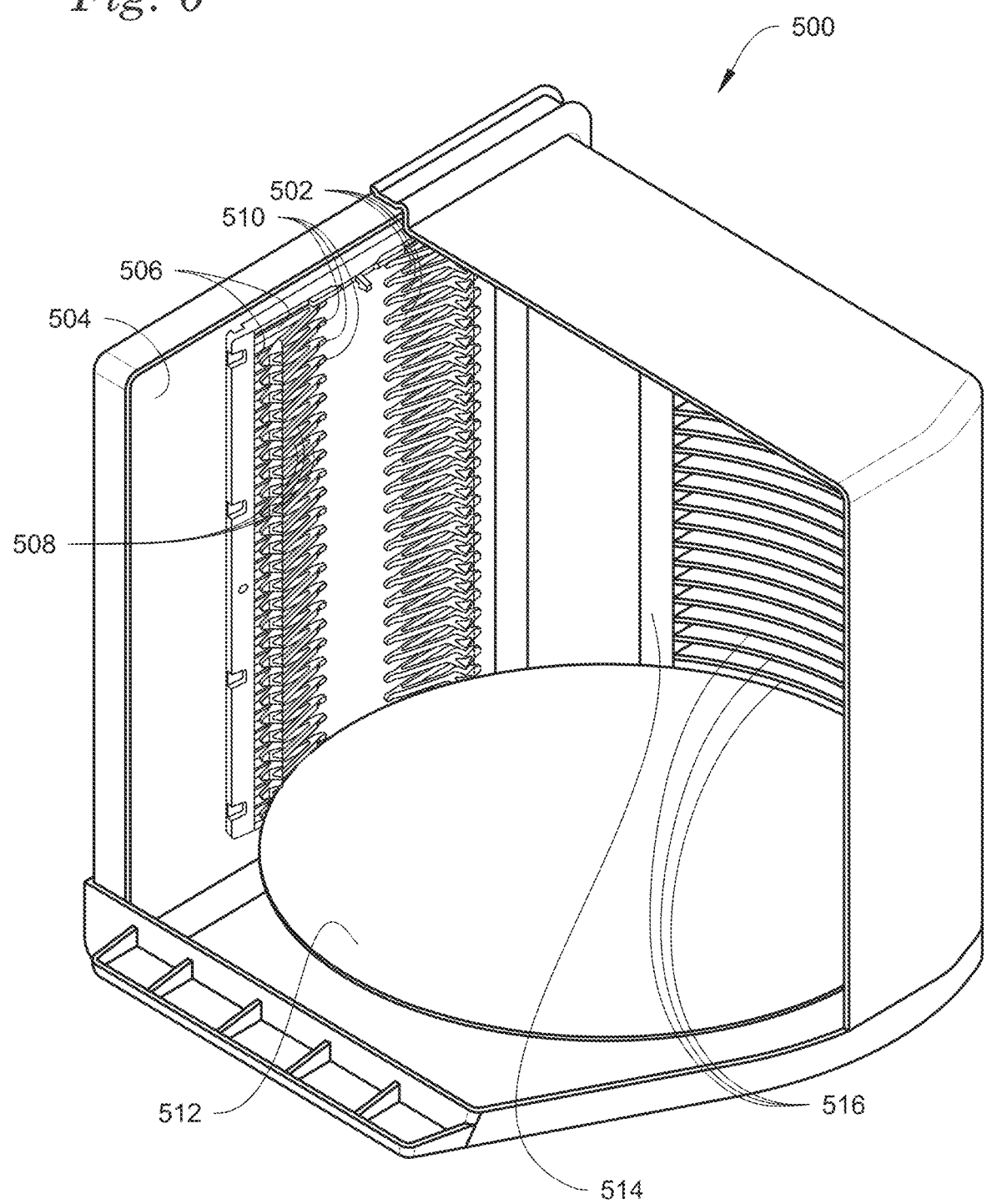
FIG. 6 shows a FOUP according to an embodiment.

FIG. 6 shows a FOUP 500 according to an embodiment. FOUP 500 includes a plurality of spring beams 502 that extend from a door 504. Each of spring beams 502 includes first arms 506 and second arms 508, with wafer contacts 510 at the end of the second arms 508.

In an embodiment, the plurality of spring beams 502 are integral with door 504 of the FOUP 500.

In an embodiment, the plurality of spring beams 502 are attached to a frame, such as frame 102 described above and shown in FIG. 1, separate from door 504 of FOUP 500. The frame can be joined to door 504 by, for example, one or more joining methods, with non-limiting examples including adhesives, snap-fit features, flanges and tabs.

Each of spring beams 502 includes a wafer contact 510. Spring beams 502 can be v-springs. Spring beams 502 can be arranged into pairs, with each pair configured to contact one substrate via the wafer contacts 510 of the spring beams 502 in the pair, when the substrate is placed within the wafer carrier. Spring beams 502 can be aligned such that the spring beams 502 together provide two wafer contacts 510 positioned to contact one substrate when the substrate is placed within FOUP 500.

Spring beams 502 each include first arm 506 and second arm 508. Second arm 508 is joined to first arm 506. First arm 506 may extend in a first direction. Second arm 508 may extend in a second direction different from the first direction that first arm 506 extends. In an embodiment, second arm 508 may extend in a direction opposite to that which first arm 506 extends. Second arm 508 can be joined to first arm 506 such that an angle is formed between first arm 506 and second arm 508. Second arm 508 can be joined to first arm 506 such that an angle is formed between first arm 506 and second arm 508. In an embodiment, the angle between the first arm 506 and the frame 502 is within a range from 0° to 40°. In an embodiment, the angle between the first arm 506 and the second arm 508 is within a range from 5° to 40°. In an embodiment, the ratio of the length of second arm 508 to the length of first arm 506 can be within a range from 2:1 to 1:3. In an embodiment, second arm 508 may have a length that is at least half the length of first arm 506. In an embodiment where the FOUP 500 is a 300 mm FOUP, the first arm 506 may have a length in the range from 55 mm to 45 mm.

Wafer contact 510 is located at the end of second arm 508, opposite where second arm 508 is joined to first arm 506. Wafer contact 510 is a feature configured to engage a substrate when the substrate is within the wafer container. Wafer contact 510 may include a surface configured to contact an edge of the substrate. In an embodiment, the surface configured to contact the edge of the substrate can be curved, with a convex shape. The convex shape may provide a rolling interface between wafer contact 510 and the substrate, and may limit the generation of particles by contact between the substrate and an edge or point along the surface. In an embodiment, wafer contact 510 is a v-groove wafer contact including ears extending away from one another, with the surface configured to contact the edge of the substrate at or near the vertex of a V-shape formed by the ears as the extend away from one another. Such a wafer contact is shown in FIG. 4A and described above. In an embodiment, wafer contact 510 is a paddle-style wafer contact, with a widened portion and two ears extending from the widened portion, parallel to one another. When the wafer contact 510 is a paddle-style wafer contact, the surface configured to contact the substrate located between the ears. Such a wafer contact is shown in FIG. 5 and described above. In an embodiment, no other wafer contacts are provided on spring beams 502 aside from wafer contacts 510 located at an end of the second arms 508 opposite where the second arms 508 are joined to first arms 506.

The plurality of spring beams 502 are positioned such that they provide the wafer contacts 510 in an internal space of the FOUP 512. In an embodiment, the spring beams 502 project into the internal space of the FOUP 512 from the door of the FOUP. The FOUP may further include wafer supports 516 along the side walls 514 of the FOUP, which support the substrates 518 while they are in the FOUP.

Aspects:

It is understood that any of aspects 1-7 can be combined with any of aspects 8-16 or aspects 17-20. It is understood that any of aspects 8-16 can be combined with any of aspects 17-20.

Aspect 1. A wafer cushion, comprising: a frame; and a plurality of spring beams, wherein each of the plurality of spring beams includes a first arm, joined to the frame and extending in a first direction to a first arm end; a second arm joined to the first arm at the first arm end and extending in a second direction, different from the first direction, to a second arm end; and a wafer contact joined to the second arm at the second arm end.

Aspect 2. The wafer cushion according to aspect 1, wherein the plurality of spring beams is configured such that when a wafer is supported by two of the plurality of spring beams, the wafer only contacts the wafer contacts at the ends of the second arms of the two of the plurality of spring beams.

Aspect 3. The wafer cushion according to any of aspects 1-2, wherein the wafer contact is a V-groove wafer contact or a paddle wafer contact.

Aspect 4. The wafer cushion according to any of aspects 1-3, wherein the surface of the wafer contact configured to contact a wafer has a convex surface.

Aspect 5. The wafer cushion according to any of aspects 1-4, wherein the first arm is joined to the frame at a perimeter of the frame, and the first direction is towards a center line of the frame.

Aspect 6. The wafer cushion according to any of aspects 1-5, wherein each of the spring beams includes a secondary contact point on the second arm, located where the second arm is joined to the first arm, and wherein the secondary wafer contact is configured to contact a wafer only when a shock event occurs.

Aspect 7. A wafer carrier, comprising a wafer cushion, wherein the wafer cushion includes: a frame; and a plurality of spring beams, wherein each of the spring beams includes: a first arm joined to the frame and extending in a first to a first arm end; a second arm joined to the first arm at the first arm end and extending in a second direction, different from the first direction to a second arm end; and a wafer contact joined to the second arm at the second arm end.

Aspect 8. The wafer cushion according to aspect 7, wherein the wafer cushion is mounted on a door of the wafer carrier.

Aspect 9. The wafer cushion according to any of aspects 7-8, wherein the wafer carrier is a front opening unified pod.

Aspect 10. The wafer cushion according to any of aspects 7-9, wherein the plurality of spring beams is configured such that when a wafer is supported by two of the plurality of spring beams, the wafer only contacts the wafer contacts at the ends of the second arms of the two of the plurality of spring beams when the wafer carrier is stationary.

Aspect 11. The wafer cushion according to any of aspects 7-10, wherein each of the wafer contacts is a V-groove wafer contact or a paddle wafer contact.

Aspect 12. The wafer cushion according to any of aspects 7-11, wherein the surface of the wafer contact configured to contact a wafer has a convex surface.

Aspect 13. The wafer cushion according to any of aspects 7-12, wherein the first arm is joined to the frame at a perimeter of the frame, and the first direction is towards a center line of the frame.

Aspect 14. The wafer cushion according to any of aspects 7-13, wherein each of the spring beams includes a secondary contact point on the second arm, located where the second arm is joined to the first arm, and wherein the secondary wafer contact is configured to contact a wafer only when a shock event occurs.

Aspect 15. A method of supporting a wafer, comprising: contacting the substrate at two wafer contacts, wherein each of the two wafer contacts joined to a separate spring beams, the spring beams each including a first arm extending in a first direction and a second arm, joined to the first and extending in a second direction, different from the first direction, and the wafer contacts are at ends of the second arms opposite where the second arms are joined to the first arms.

Aspect 16. The method according to aspect 15, further comprising contacting the substrate at two secondary contact points on the second arms of the v-springs on which the wafer contacts are located when a shock event occurs.

Aspect 17. The method according to aspect 15, wherein the substrate is in contact with the spring beams only at the two wafer contacts.

Aspect 18. The method according to any of aspects 15-17, wherein the wafer contacts have a convex surface where they are configured to contact the substrate.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in the details, particularly in matters of shape, size, and arrangement of parts without exceeding the scope of the disclosure. The disclosure's scope is, of course, defined in the language in which the appended claims are expressed.

The invention claimed is:

1. A wafer cushion, comprising:
   a frame; and
   a plurality of spring beams, wherein each of the plurality of spring beams includes:
      a first arm, joined to the frame and extending in a first direction apart from the frame to a first arm end;
      a second arm joined to the first arm at the first arm end and extending in a second direction, different from the first direction, to a second arm end, and wherein the second arm is bowed toward the first arm; and
      a wafer contact joined to the second arm at the second arm end, wherein the wafer contact has a width greater than a width of a portion of the second arm and the first arm, where joined to the frame, extends away from the second arm,
      wherein each of the spring beams includes a secondary contact point on the second arm, located where the second arm is joined to the first arm, and wherein the secondary wafer contact is configured to contact a back of the wafer only when a shock event occurs.

2. The wafer cushion of claim 1, wherein the plurality of spring beams is configured such that when a wafer is supported by two of the plurality of spring beams, the wafer only contacts the wafer contacts at the ends of the second arms of the two of the plurality of spring beams.

3. The wafer cushion of claim 1, wherein the wafer contact is a V-groove wafer contact or a paddle wafer contact.

4. The wafer cushion of claim 1, wherein the surface of the wafer contact configured to contact a wafer has a convex surface.

5. The wafer cushion of claim 1, wherein the first arm is joined to the frame at a perimeter of the frame, and the first direction is towards a center line of the frame.

6. A wafer carrier, comprising a wafer cushion, wherein the wafer cushion includes:
   a frame; and
   a plurality of spring beams, wherein each of the plurality of spring beams includes:
      a first arm joined to the frame and extending in a first direction apart from the frame to a first arm end;
      a second arm joined to the first arm at the first arm end and extending in a second direction, different from the first direction to a second arm end, and wherein the second arm is bowed toward the first arm; and
      a wafer contact joined to the second arm at the second arm end, wherein the wafer contact has a width greater than a width of a portion of the second arm and the first arm, where joined to the frame, extends away from the second arm,
      wherein each of the spring beams includes a secondary contact point on the second arm, located where the second arm is joined to the first arm, and wherein the secondary wafer contact is configured to contact a back of the wafer only when a shock event occurs.

7. The wafer carrier of claim 6, wherein the wafer cushion is mounted on a door of the wafer carrier.

8. The wafer carrier of claim 6, wherein the wafer carrier is a front opening unified pod.

9. The wafer carrier of claim 6, wherein the plurality of spring beams is configured such that when a wafer is supported by two of the plurality of spring beams, the wafer only contacts the wafer contacts at the ends of the second arms of the two of the plurality of spring beams when the wafer carrier is stationary.

10. The wafer carrier of claim 6, wherein each of the wafer contacts is a V-groove wafer contact or a paddle wafer contact.

11. The wafer carrier of claim 6, wherein the surface of the wafer contact configured to contact a wafer has a convex surface.

12. The wafer carrier of claim 6, wherein the first arm is joined to the frame at a perimeter of the frame, and the first direction is towards a center line of the frame.

* * * * *